United States Patent [19]

Herber

[11] 4,124,807
[45] Nov. 7, 1978

[54] BISTABLE SEMICONDUCTOR FLIP-FLOP HAVING A HIGH RESISTANCE FEEDBACK

[75] Inventor: Richard J. Herber, Chalfont, Pa.

[73] Assignee: Solid State Scientific Inc., Montgomeryville, Pa.

[21] Appl. No.: 723,100

[22] Filed: Sep. 14, 1976

[51] Int. Cl.² ............... H03K 3/286; H03K 3/353; H03K 27/00; H03B 19/14
[52] U.S. Cl. ............... 307/279; 307/225 C; 307/303; 357/42
[58] Field of Search ............ 307/205, 213, 220 C, 307/221 C, 224 C, 225 C, 251, 279, 289, 291, 303; 357/42

[56] References Cited

U.S. PATENT DOCUMENTS

| 3,406,346 | 10/1968 | Wanlass | 307/221 C X |
|---|---|---|---|
| 3,431,433 | 3/1969 | Ball et al. | 307/221 C |
| 3,745,371 | 7/1973 | Suzuki | 307/221 C |
| 3,766,408 | 10/1973 | Suzuki et al. | 307/279 X |
| 3,821,781 | 6/1974 | Chang et al. | 307/205 X |
| 3,823,551 | 7/1974 | Riehl | 307/225 C X |
| 3,886,583 | 5/1975 | Wang | 357/42 X |
| 3,887,822 | 6/1975 | Suzuki | 307/279 |
| 3,922,566 | 11/1975 | Kodama et al. | 307/225 C X |
| 3,989,955 | 11/1976 | Suzuki | 307/279 X |
| 4,025,800 | 5/1977 | Wanlass | 307/225 C |

OTHER PUBLICATIONS

Seidel et al. "Buried-Guarded Layer Ion-Implanted Resistors", *IEEE Trans. on Electron Devices*, vol. ED-20, No.8;8/1973; pp. 744-748.
Surgent, "Insulated Gate Field-Effect Transistor Sense Amplifier Latch;" *IBM Tech.Discl. Bull;* vol. 13, No. 9, pp. 2670-2671; 2/1971.

*Primary Examiner*—Larry N. Anagnos
*Attorney, Agent, or Firm*—Frailey & Ratner

[57] ABSTRACT

A CMOS bistable semiconductor flip-flop circuit having a storage element formed by a first and a second inverter. The output of the second inverter is directly connected to the input of the first inverter. The first inverter output is coupled to the second inverter input through a high resistance feedback of resistance value which is substantially high with respect to the low output impedance of the first inverter. A charge storage device and gates alternately store the state of the storage element and thereafter provide the stored signal to the second inverter input. Additionally, a device is connected to the input of the second inverter to provide a reset or set function.

10 Claims, 14 Drawing Figures

4,124,807

BISTABLE SEMICONDUCTOR FLIP-FLOP HAVING A HIGH RESISTANCE FEEDBACK

BACKGROUND OF THE INVENTION

A. Field of the Invention

This invention relates to the field of art of semiconductor bistable flip-flop circuits.

B. Prior Art

Much prior work has been done in the field of bistable flip-flop circuits made of semiconductor field effect transistors (FET). These transistors have been used in complex monolithic substrates or chips. An important economic consideration in making chips has been minimizing the area on the chip taken up by each individual circuit by minimizing its number of circuit elements. However, prior stable flip-flops which have been designed have left much to be desired in that they have required a substantial number of individual transistors. For example, prior CMOS stable flip-flop circuits with reset have required 18 transistors in order to provide proper gating functions. Other prior stable flip-flop circuits have required two pairs of cross-connected inverters with each pair having its own transmission gate which was necessary to gate the cross-connection feedback signal and in this way to change the stable state.

Accordingly, an object of the present invention is to reduce the numbers of transistors used in a bistable FET flip-flop circuit.

SUMMARY OF THE INVENTION

A bistable semiconductor flip-flop circuit with the storage element thereof being formed of a first and a second inverter. Coupling means connects the output of the second inverter to the input of the first inverter. A semiconductor device operates as a source of switching voltage to the input of the second inverter. High resistance means connects the output of the first inverter to the input of the second inverter. The high resistance means is of resistance value which is substantially high with respect to the low output impedance of the first inverter to permit the second inverter input to change in potential to that of the switching voltage.

DETAILED DESCRIPTION

Figure 1:
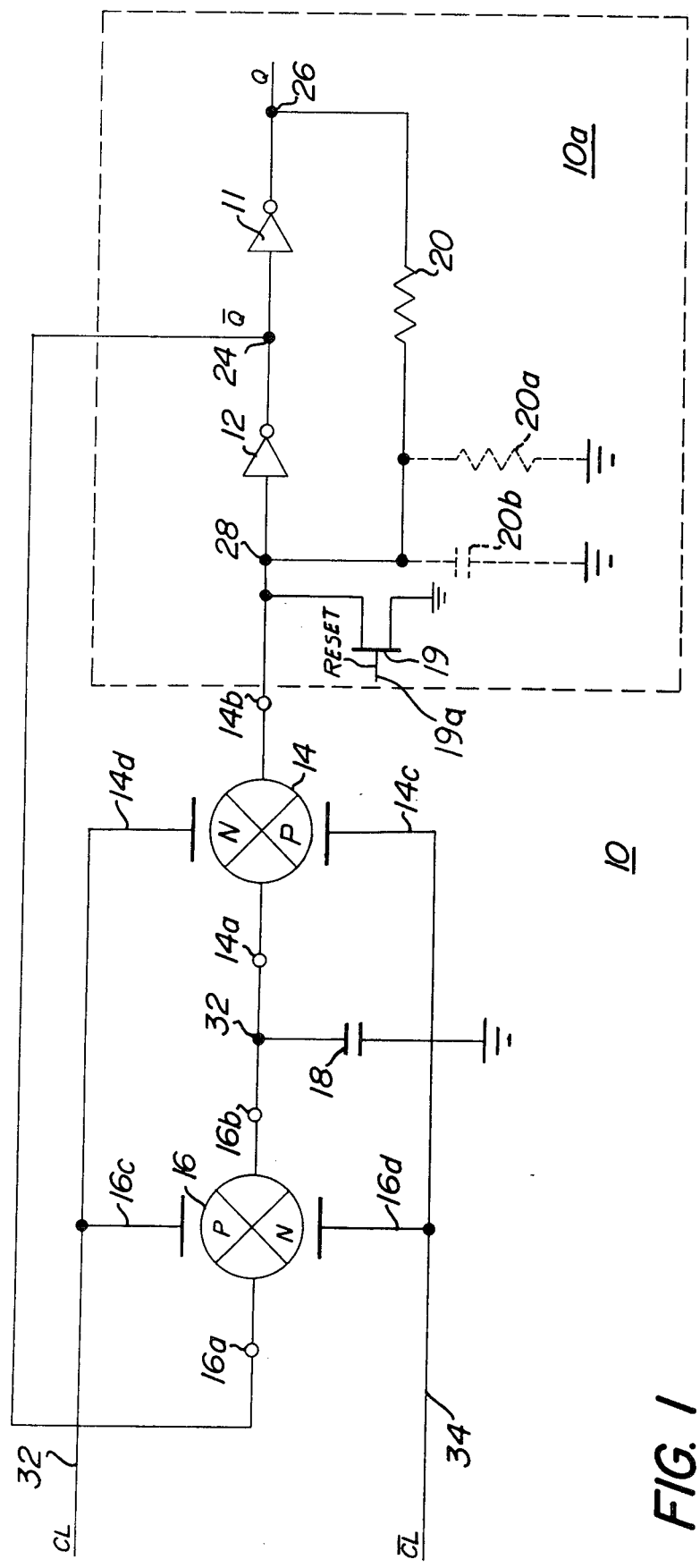
FIG. 1 illustrates a circuit diagram of a flip-flop embodying the invention.

Referring now to FIG. 1, there is shown a flip-flop circuit 10 made of circuit elements formed on a complementary metal oxide semiconductor (CMOS) chip. Flip-flop 10 comprises a storage element or memory cell 10a having two stable states (bistable) and a pair of transmission gates 14, 16 which are effective to switch the stable state of element 10a by applying a switching voltage to junction 28. In addition, reset device 19 is effective to apply a switching voltage to reset element 10a.

Storage element 10a comprises a pair of cross-connected inverters (11, 12) with the output of inverter 12 cross-connected by way of junction 24 ($\overline{Q}$ output) to the input of inverter 11. In other cross-connection, the output of inverter 11 is coupled by way of junction 26 (Q output) through a high resistance feedback resistor 20 to junction 28, and then to the input of inverter 12. A single N channel CMOS device 19 is connected between junction 28 and ground. When a reset signal (high) is applied to input 19a of device 19, the cross-connected inverters 11, 12 are reset with a low at junction 28 and a high at junction 24.

In order to provide for the switching of storage element 10a, junction 24 is coupled to terminal 16a of transmission gate 16 and junction 28 is coupled to terminal 14b of transmission gate 14. As will later be described in detail, transmission gates 14 and 16 operate so that with the "c" terminal low and the "d" terminal high, the respective transmission gate is turned "on" so that the "a" terminal is connected to the "b" terminal through a low resistance path. On the other hand, with the "c" terminal high and the "d" terminal low, there is a very high resistance between the "a" and "b" terminals for the transmission gate's "off" state.

Gate terminals 16b and 14a are coupled together at junction 32 and to one terminal to storage capacitor 18. The other terminal of capacitor 18 is connected to ground. Switching pulses such as clock (CL) pulses are applied by way of conductor 32 to terminals 16c and 14d. The complement of those pulses such as clock ($\overline{CL}$) pulses are applied by way of conductor 34 to terminals 16d and 14c.

Figure 2:
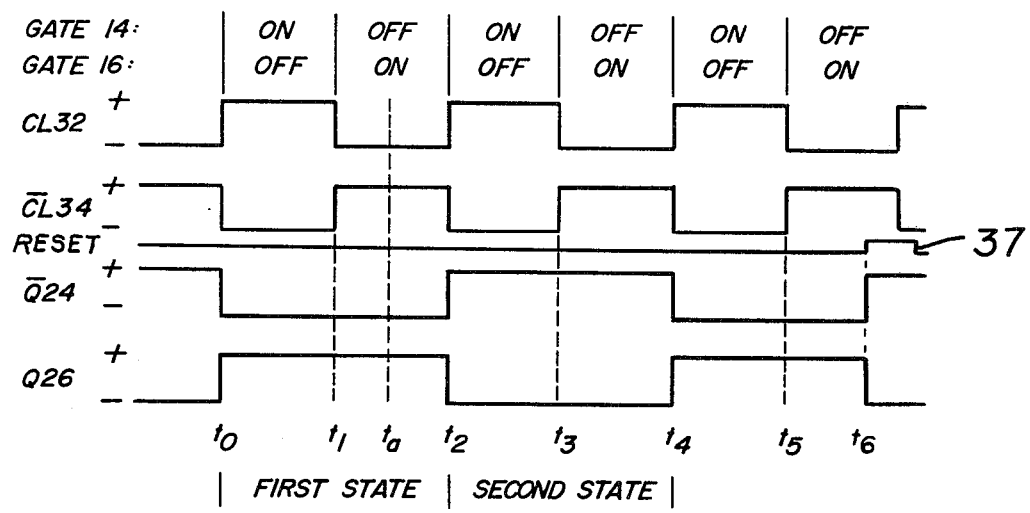
FIG. 2 illustrates waveforms helpful in analyzing the operation of FIG. 1.

In operation, it will first be assumed that storage element 10a is in its first stable state, as shown in FIG. 2, in which junction 28 is high, junction 24 ($\overline{Q}$) is low and junction 26 (Q) is high and device 19 is in its off state. For the purpose of explanation, a low will be defined as substantially equal to ground, and similarly, a high as a positive potential. In the first stable state, the high on junction 26 is fed back through high resistance feedback resistor 20 to junction 28. Thus, with a high at junction 26 and a high at junction 28, storage element 10a is held in the first stable state indefinitely and so long as device 19 is in its off state. It will be understood in CMOS chip technology that there is inherent resistance to ground or the positive supply ($V_{DD}$) terminal from the high resistance feedback 20. This resistance may be represented by a resistance 20a coupled between junction 28 and ground. Resistance 20a would have the affect of leaking or removing the high charge on junction 28 to ground. However, as later explained in detail the resistance value of resistor 20 is substantially small with respect to the value of resistance 20a. Accordingly, the presence of resistance 20a does not cause the voltage at junction 28 to fall below the required threshold for a high of element 10a. This may also be viewed as the feedback flow through resistor 20 being effective to compensate for any leakage through resistance 20a which would have the effect of removing charge from junction 28.

Element 10a remains in the first stable state from time $t_0$ to time $t_2$ as shown in FIG. 2. The following operation starts at time $t_a$. Accordingly, with CL low and $\overline{CL}$ high, gate 16 is turned "on" and gate 14 is turned "off". Thus the low at terminal 24 is applied through turned on gate terminals 16a, b and then to junction 32 thereby to charge capacitor 18 with a low. Since gate 14 is off, junction 28 is not coupled to junction 32.

At time $t_2$, when the clock signals change state, the conductivity state of gates 16, 14 reverse so that gate 16 is "off" and gate 14 is "on." Accordingly, the low at junction 32 is applied through ON gate 14 to junction 28. Since there is a limited amount of charge stored on capacitor 18, junction 32 may be considered a "soft node" since in time the charge would leak off from junction 32. However, in order to switch the state of junction 28, the low at junction 32 must be effective to overcome the high at junction 28. If there were a direct connection from junction 26 to junction 28 instead of through a high resistance feedback 20, then the charge on capacitor 18 could not significantly change the voltage at junction 28 because of the low output impedance of inverter 11. It will be understood that CMOS inverters exhibit low output impedance in either state.

As a result of the limit of the current feedback from junction 26 due to feedback resistor 20, the low at junction 32 is able to drive junction 28 low. The low that now becomes established at junction 28 is propagated through inverter 12 and then inverter 11. Accordingly, a high is produced at junction 24 and a low at junction 26. In this way, element 10a switches from the first to the second stable state at time $t_2$. Storage element 10a remains in the second stable state between times $t_2-t_4$ since the low at junction 26 is fed back through resistor 20 to junction 28.

As previously described at time $t_2$, gate 16 is turned off and thus the high at junction 24 does not affect junction 32. However, at time $t_3$, the clock signals switch state thereby to turn on gate 16 and turn off gate 14. Accordingly, the high at junction 24 is coupled through on gate 16 thereby to charge capacitor 18 to a high. However, this switching of gates 16 and 14 has no affect on the stable state of element 10a.

Element 10a remains in its second stable state until time $t_4$ when the clock signals again change state thereby to turn off gate 16 and turn on gate 14. At this time, the high at junction 32 is effective to overcome the low at junction 28. Thus, in a manner similar to that previously described, feedback resistor 20 is effective in limiting the current flow between junctions 28 and 26, and thereby limiting the rate of discharge of capacitor 18. In this manner, junction 28 is held high until that high is able to propagate through inverters 12 and 11, establishing a low at junction 24 and a high at junction 26. In this way, at time $t_4$ element 10a switches to its first stable state. It will be understood that time $t_4$ is equivalent, in switching of flip-flop 10, to time $t_0$ when element 10a switched to its first state.

At time $t_5$, the clock signals switch state and gate 16 is turned on and gate 14 is turned off. Accordingly, capacitor 18 is now charged to the low and the operation may continue in the manner previously described with respect to time $t_4$. However, for the purpose of explanation at time $t_6$, a high reset pulse 37 may be applied to transistor 19 which is effective to reset element 10a to the second state with junction 26 low and junction 24 high. Since device 19 is coupled to the input of second inverter 12, this device may be of substantially small size and still perform the reset function since high resistance 20 is effective to isolate the output of inverter 11 from the reset device 19. In addition, any Q and Q̄ skew entering the reset state and also undesired transients produced by additional clocks while being held in the reset state are minimized by device 19 being placed at the input of inverter 12. It will be understood that a set function may be produced by a P channel device coupled between junction 28 and $V_{DD}$. Specifically, a low applied to an input of such a P channel device would produce a high at junction 28 and a low at junction 24 for the set function.

It will now be understood that in operation of flip-flop 10, gate 16 is turned on to thereby permit storage capacitor 18 to charge to the then present state of storage element 10a. Then, while still maintaining that state of element 10a, gate 16 is turned off and gate 14 is turned on to allow the charge on capacitor 18 to switch element 10a to its other stable state. In this manner, storage capacitor 18 is charged to a level to represent the then present state of element 10a. Thus, capacitor 18 stores the state of element 10a and provides a charge to then switch the stable state upon switching of the gates. In this manner, capacitor 18 together with gates 14, 16 provide a source of switching voltage to storage element 10a.

The following is an analysis of storage element 10a to determine the upper and lower bounds of the value of its feedback resistor 20 and also the bounds of value of storage capacitor 18. The maximum value of resistor 20 must be sufficiently low with respect to the lowest anticipated value of inherent leakage resistance 20a so that the voltage divider comprising resistors 20 and 20a does not attenuate the voltage from junction 26 below the threshold level at the input (junction 28) of inverter 12. On the other hand, the minimum value of resistor 20 must be sufficiently high so that the charge on storage capacitor 18 is not drained off before the voltage that is initially applied to the input of inverter 12 upon turn-on of gate 14 can propagate through inverter 12 and then through inverter 11 to be fed back again by way of resistor 20 to the input of 12. If this voltage decreased too rapidly, the loop would not lock itself up in the new state; rather it would just emit a brief pulse and return to the state that it was previously in. In other words, the value of resistor 20 must be sufficiently high with respect to the impedance of the source of switching voltage.

The minimum value of storage capacitor 18 must be high enough with respect to stray capacitance 20b so that the initial voltage is not decreased below the threshold voltage of inverter 12 (state threshold) at the time gate 14 is turned on. On the other hand, the maximum value of capacitor 18 must be low enough so that it is fully charged by the output of inverter 12 (which has a low but non-zero source impedance) within the time that the clock 32 is low. Specifically, the maximum operating frequency of the clock input for the embodiment shown in FIG. 1 will be limited by this factor.

A typical range of values for leakage resistor 20a may extend from $10^{10}$ to $2 \times 10^{13}$ ohms. Using the lower of these two values as the worst case, an upper limit of feedback resistor 20 may be arbitrarily taken as one tenth of that value or $10^9$ ohms. Thus, it can be seen that a 10 volt change at junction 26 will create no less than a 9 volt change at junction 28. This is well above a nominal threshold value of $V_{DD}/2$ volts. Similarly, the stray capacitance 20b has been determined to have a value not exceeding 0.4 picofarad. After the redistribution of the charge between capacitors 18 and 20b, it is essential that the resultant voltage on junction 28 reflect the logic level stored on capacitor 18 prior to transmission gate 14 turning on. This condition requires capacitor 18 to be greater than 0.4 picofarad. However, to provide for some tolerance of noise, a greater minimum value, say 1.6 picofarad would be used. Thus, when gate 14 is turned on and storage capacitor 18 is connected in parallel with stray capacitor 20a, the total charge distributed over the total capacitance results in a final value of, about 8 volts if the initial value on capacitor 18 alone were 10 volts.

With the value of capacitor 18 taken as 1.6 picofarad, the maximum combined capacitance including stray capacitance 20b would be 2 picofarad. Typical maximum propagation delays through inverters 12 and 11 may be, for example, 75 nanoseconds each or 150 nanoseconds total. Therefore, the time constant represented by the product of total capacitance and feedback resistance must be such that the time for the voltage on the capacitance to decay from 8 volts to 5 volts, which is the absolute minimum threshold for inverter 12, be more than or equal to 150 nanoseconds. The relationship of the above elements may be expressed.

$$RC \geq [T_p/\ln(V_i/V_t)] \quad (1)$$

In equation 1, RC is the time constant of the feedback resistor 20 and the total capacitance represented by storage capacity 18 and stray capacitance 20b. $T_p$ represents the total propagation through inverters 12 and 11 and $V_i$ is the initial voltage of the capacitance at the time gate 14 is turned on. $V_t$ represents the threshold voltage at the input of inverter 12 (junction 28). Substituting the aforementioned values in equation 1, it can be seen that RC must equal or exceed 300 nanoseconds.

$$RC \geq [150 \times 10^{-9}]/[\ln(8/5)] \quad (2)$$

Since C has been assumed to be $2 \times 10^{-12}$, it follows that R must equal or exceed 150,000 ohms. Thus, it can be seen that almost four orders of magnitude of range exist between minimum and maximum allowable values for feedback resistor 20. In making the CMOS chip, the value of feedback resistance 20 may preferably be made 800 K ohms ± 50% which value is well within the aforementioned range.

In an embodiment of the invention, flip-flop 10 may be used in certain high frequency applications. In these applications, capacitor 18 may have a smaller capacitive value than previously described in order to utilize smaller voltage transitions around the inverter thresholds.

Flip-flop 10 may be fabricated using aluminum gate complementary MOS transistors with an ion implanted resistor forming feedback resistor 20. As shown in FIGS. 3-14, such a fabrication method for most of flip-flop 10 is described as follows.

Figure 3:
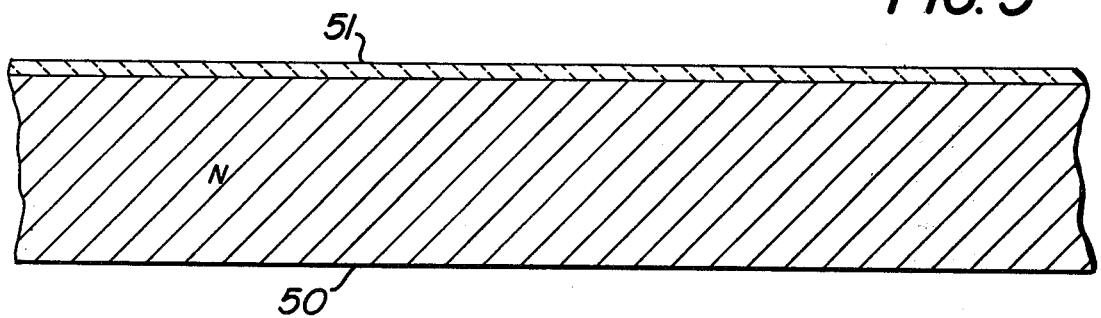
FIGS. 3–14 is a series of schematic illustrations of a vertical cross-section of a semiconductor wafer in the respective steps of formation of most of the flip-flop circuit shown in FIG. 1.
Figure 4:
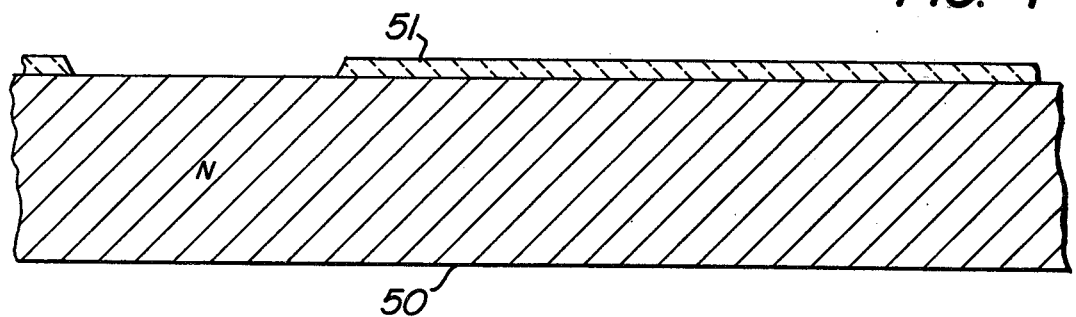

The starting material is a wafer of N type silicon having a resistivity of 2 to 4 ohm-centimeters. Step 1 in the process is the initial oxidation step which grows a silicon dioxide film 51 on an N type silicon wafer 50 to a thickness of approximately 7500 Angstroms, as shown in FIG. 3. The first photo engraving step, Step 2, is shown in FIG. 4 in which a hole is etched through film 51 down to the silicon substrate 50 after which the photo resist is removed resulting in the cross section shown in FIG. 4. In Step 3, the photo resist is removed, and the wafer is subjected to a boron ion implanation which provides the P⁻ well 54 for the N channel transistor 52.

Figure 5:
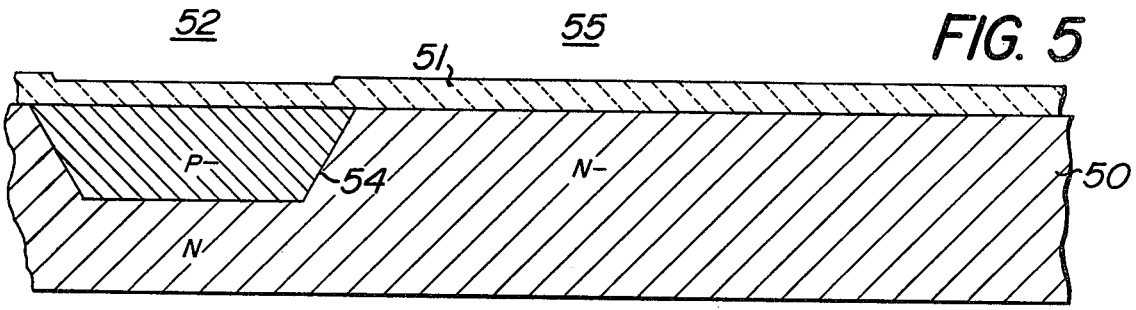

Step 4 is the P⁻ drive-in, high temperature drive in and re-oxidation. This increases the depth of well 54 to approximately 16 microns into substrate 50 and covers it with a layer of oxidation as shown in FIG. 5.

Figure 6:
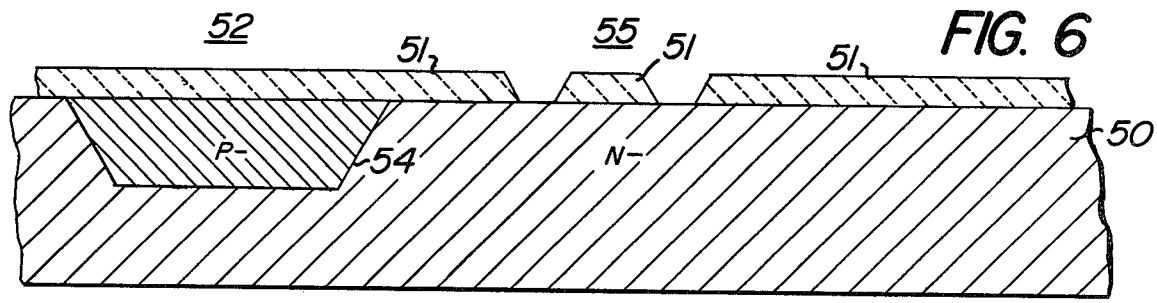

Step 5 creates the P⁺ region on the wafer. Holes are etched by photo engraving through oxide film 51 to the silicon 50 as shown in FIG. 6.

Figure 7:
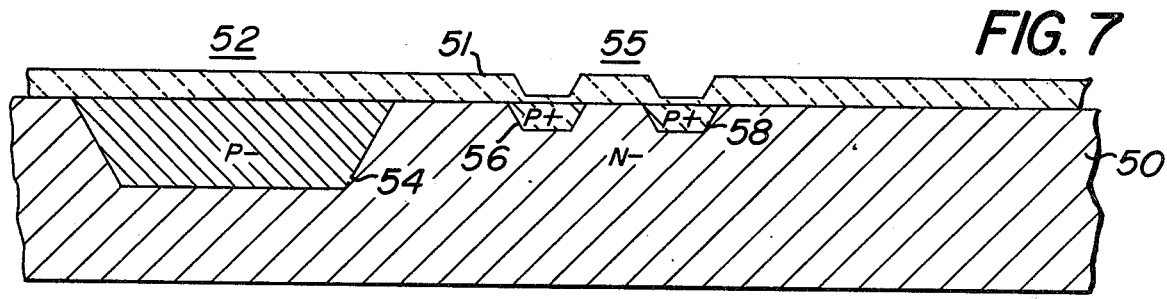

In Step 6, the photo resist is removed, ions are diffused through the holes to form the P⁺ areas 56 and 58; and the surface is re-oxidized as shown by FIG. 7. Basically, the P⁺ diffusion provides the source and drain regions for the P channel MOS transistor 55.

Figure 8:
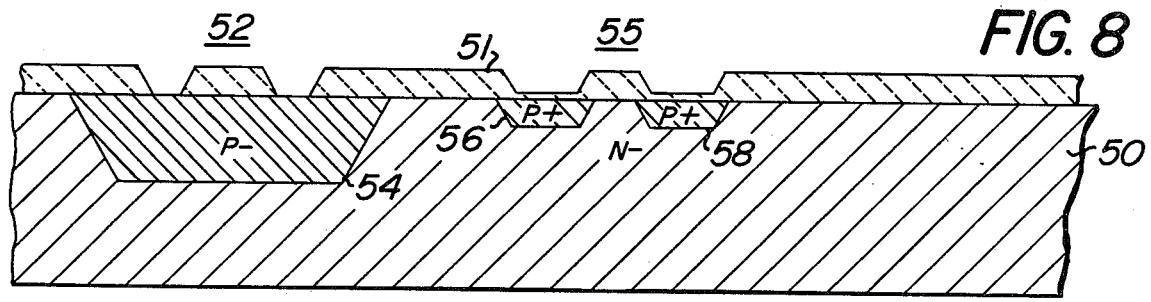

Step 7 is N⁺ photo engraving which opens holes in to the P-well region 54 or subsequent N⁺ diffusion, as shown by FIG. 8.

Figure 9:
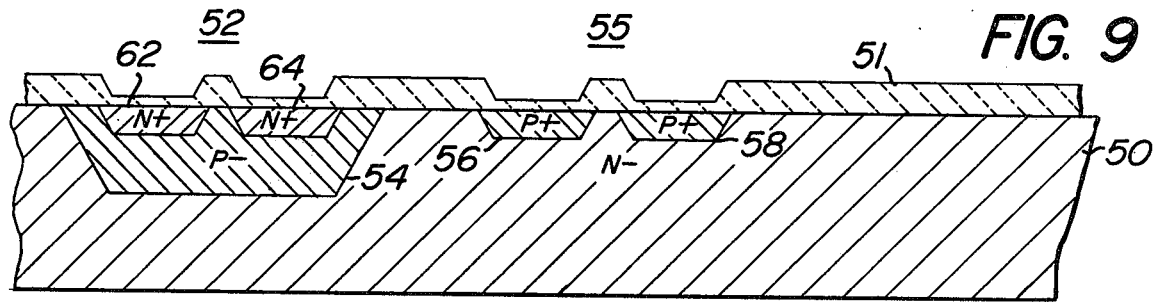

Step 8 is N⁺ diffusion and re-oxidation. The N⁺ regions are diffused which provide the source/drain regions 62 and 64 for the N channel transistor 52 of the complementary pair of N and P channel devices as shown in FIG. 9.

Figure 10:
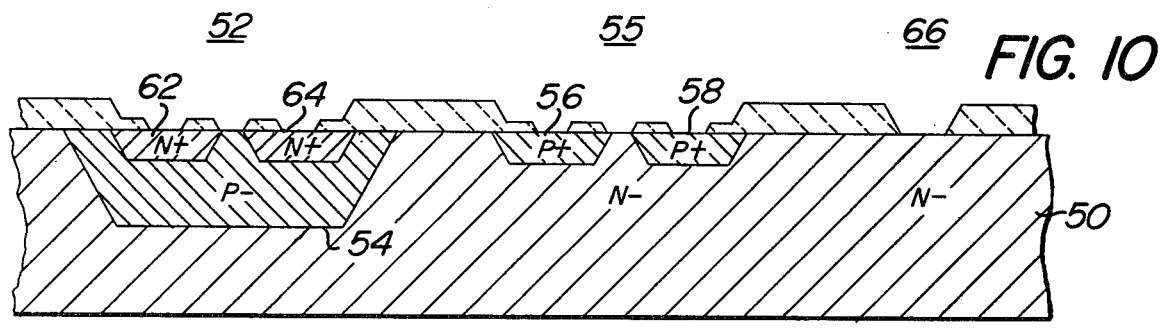

Step 9 is gate photo engraving. This defines the gate region, contact region and the ion implanted resistor geometry as shown in FIG. 10. It is similar to the ones described just previously.

Step 10 is gate oxidation and annealing. This basically grows a gate oxide 68 that provides an insulating layer which is approximately 750 Angstroms of silicon dioxide over the clear silicon regions that were open in step 9. This forms a gate oxide over region 72 and provides a gate oxide 68 for the gate inputs of the MOS transistors, the N channel 52 and the P channel 55.

Step 11 is contact photo engraving. This opens holes through the silicon dioxide 51 for electrical contact to the source/drain regions of the transistors.

Figure 11:
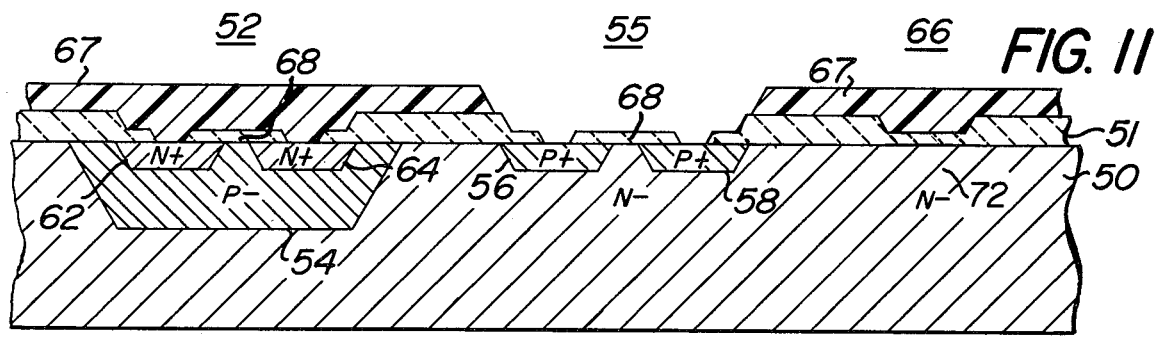

Step 12 is a photo engraving step which covers all the active devices with photo-resist 67 except the P channel transistor 55. This acts as a mask against the subsequent boron ion implantation which is used to set the threshold voltage of the P channel transistor as shown in FIG. 11. Step 13 is boron ion implantation in which boron ions are implanted into the P channel transistor 55 which adjust the threshold voltage to a range of 0.5 to 1.0 volts.

Figure 12:
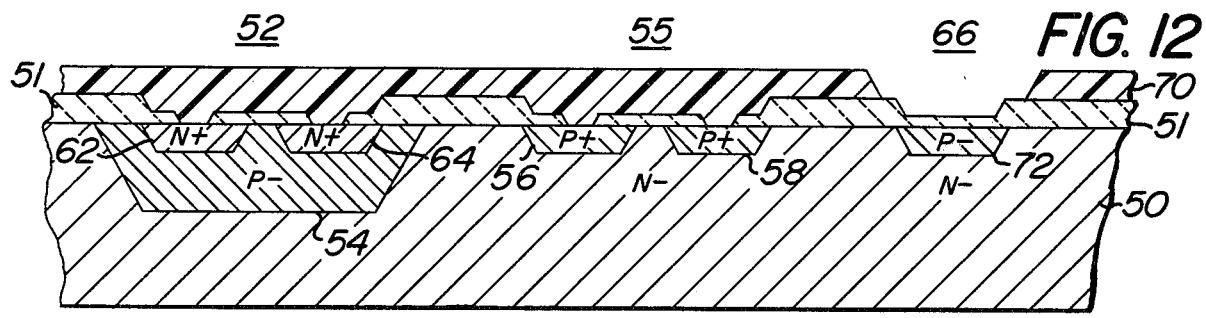

Step 14 implanted resistor photo engraving as illustrated by FIG. 12. Photo resist 70 is coated on the wafer to cover all active devices with photo resist except resistor 72 which corresponds to resistor 20, FIG. 1.

Step 15 is implantation of boron ions into the resistor region 66 which forms a high resistivity P-type ion implanted resistor 72 after which photo resist 70 is completely removed from the wafer. Nominal sheet resistance of the implanatation is 50,000 ohms/square. In step 16, 11,000 Angstroms of pure aluminum 74 are deposited across the entire wafer. An example of such resistor is described in T. F. Seidel and W. D. Gibson, "Buried Guarded Layer Ion Implanted Resistors," IEEE Transactions on Electron Devices, ED-20, No. 8, pages 744-748, August 1973.

Step 17 is metal photo engraving. Photo resist is used as a mask for etching the metal. Basically, the metal photo engraving defines the metal interconnect pattern which connects the N and P channel transistors together with the high value resist to form the complementary pair and basic building blocks of the subject flip-flop.

Figure 13:
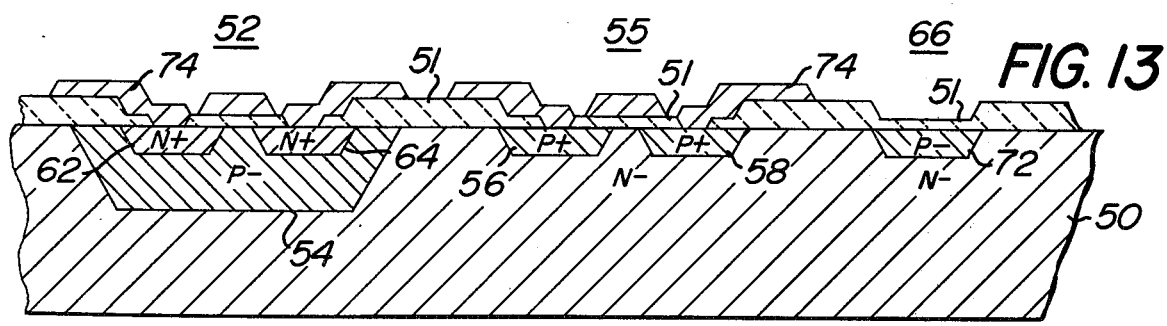
Figure 14:
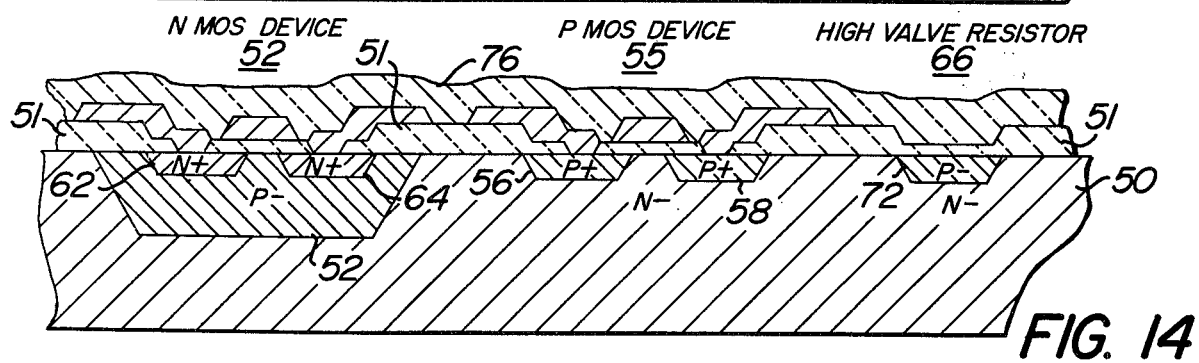

Step 18 is metal etching, wherein the aluminum is etched to define the interconnect pattern which is shown in FIG. 13.

Step 19 is passivation oxide deposit. The glass-like oxide serves as a barrier to contaminents and also serves as a scratch protection during further processing.

Step 20 is passivation photo engraving. This photo engraving step opens up holes through the passivation oxide 76 so that electrical contact can be made to the terminal pads of the circuit by bonding wires thereto which are connected to pins of the carrier package.

It will be understoood that the area occupied on the wafer by resistor 72 whose implantation is described in Step 15 above is significantly less than that which would be occupied by P type and N type transistors which would have to be present to form additional transmission gates to otherwise complete the functions of flip-flop 10. Further, the resistor occupies less area than either of inverters 11, 12 it is associated with in storage element 10a.

What is claimed is:

1. A CMOS bistable semiconductor flip-flop circuit having two stable states formed on a CMOS chip having an N-substrate comprising
   first and second inverters forming a storage element each having a substantially low output impedance in both said stage states and each having an input and an output,
   coupling means connecting said output of said second inverter to said input of said first inverter,
   means for applying a switching voltage to said second inverter input,
   high resistance means connecting said output of said first invertor to said input of said second inverter, said high resistance means being of resistance value which is substantially high with respect to the low output impedance of said first inverter to permit said second inverter input to change in potential to that of the switching voltage and allow said switching voltage to propagate through both inverters before termination of said switching voltage thereby to change the stable state of said storage element, said high resistance means comprising a high resistivity resistor boron ion implanted through an overlying gate oxide layer forming a high resistance P- region within said N-substrate, said resistor having a guarded layer overlied by said gate oxide layer, and a glass passivation layer overlying said resistor.

2. The CMOS flip-flop circuit of claim 1 in which said glass passivation layer is directly formed on and contacts said overlying gate oxide layer and in which said high resistivity resistor has a nominal sheet resistance of about 50,000 ohms/square.

3. The CMOS flip-flop circuit of claim 2 in which said high resistivity resistor is of area substantially less than the area of each of said inverters.

4. The CMOS flip-flop circuit of claim 3 in which said first and second inverters are formed of aluminum gate CMOS transistors and said substrate is silicon having a resistivity of 2 to 4 ohms-centimeters.

5. The CMOS flip-flop circuit of claim 4 in which said high resistivity resistor has a preferred value of 800 kohms plus or minus 50%.

6. The CMOS bistable semiconductor flip-flop circuit of claim 4 in which said flip-flop circuit has a leakage resistance from said input of said second inverter to the substrate of said chip, said resistor having a resistance value which is low with respect to said leakage resistance and is high with respect to the source impedance of said switching voltage applying means.

7. The bistable flip-flop circuit of claim 6 in which there is provided first and second transmission gates each having first and second switched terminals,
   means for applying switching pulses to both of said gates for alternately (1) turning on one of the gates for providing a substantially conductive path between said first and second switched terminals and (2) turning off the other of said gates for providing a substantially nonconductive path between said switched terminals,
   said second terminal of said first gate being coupled to said input of said second inverter, said first terminal of said second gate being coupled to said coupling means, and
   charge storage means coupled to said first and second terminals of said first and second gates respectively for storing the state of said storage element with said second gate on and said first gate off and to allow the charge to provide said switching voltage with said first gate on and said second gate off.

8. The bistable semiconductor flip-flop circuit of claim 7 in which said charge storage means is a storage capacitor and in which said CMOS chip has stray capacitance effectively coupled between said input of said second inverter and the substrate of said chip,
   said storage capacitor being of value sufficiently greater than said stray capacitance so that when said storage capacitance provides said switching voltage and thus charges the stray capacitance, the switching voltage does not change beyond the state threshold.

9. The bistable semiconductor flip-flop circuit of claim 8 in which said storage capacitor is of value sufficiently small so that it is charged to the state of said storage element when said second gate is turned on and said first gate is turned off.

10. The bistable semiconductor flip-flop circuit of claim 9 in which said switching voltage applying means comprises reset and set means coupled to said second inverter input and means for applying reset and set signals respectively to said reset and set means.

* * * * *

UNITED STATES PATENT OFFICE
CERTIFICATE OF CORRECTION

PATENT NO. : 4,124,807
DATED : November 7, 1978
INVENTOR(S) : Richard J. Herber

It is certified that error appears in the above-identified patent and that said Letters Patent are hereby corrected as shown below:

Column 7, line 21, change "stage" to --stable--.

Signed and Sealed this

Twentieth Day of March 1979

[SEAL]

Attest:

RUTH C. MASON
Attesting Officer

DONALD W. BANNER
Commissioner of Patents and Trademarks